US007642856B1

(12) United States Patent
Terrovitis

(10) Patent No.: US 7,642,856 B1
(45) Date of Patent: Jan. 5, 2010

(54) AMPLIFIER CAPABLE OF USING A POWER SUPPLY VOLTAGE HIGHER THAN ITS PROCESS VOLTAGES

(75) Inventor: Manolis Terrovitis, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 465 days.

(21) Appl. No.: 11/421,053

(22) Filed: May 30, 2006

(51) Int. Cl.
*H03F 3/04* (2006.01)
(52) U.S. Cl. .................................... 330/298
(58) Field of Classification Search .............. 330/51, 330/207 P, 298
See application file for complete search history.

(56) References Cited

U.S. PATENT DOCUMENTS

| | | | | |
|---|---|---|---|---|
| 3,737,800 | A * | 6/1973 | Russell et al. ............ | 330/207 P |
| 5,930,094 | A * | 7/1999 | Amerasekera et al. ........ | 361/56 |
| 6,018,267 | A * | 1/2000 | Tran et al. ................... | 330/253 |
| 6,703,813 | B1 * | 3/2004 | Vladislav et al. ............ | 323/270 |
| 7,135,914 | B2 * | 11/2006 | Chih et al. .................. | 327/543 |
| 7,166,991 | B2 * | 1/2007 | Eberlein ..................... | 323/280 |
| 7,348,855 | B2 * | 3/2008 | Wu ............................ | 330/300 |

FOREIGN PATENT DOCUMENTS

CN 101083452 A * 12/2007

OTHER PUBLICATIONS

Potanin, V. and Potanina, E.; High Voltage Tolerant Power Supply in a Low Voltage CMOS Technology; 2004; IEEE ISCAS I-393 to I-396.*

* cited by examiner

*Primary Examiner*—Robert Pascal
*Assistant Examiner*—Khiem D Nguyen
(74) *Attorney, Agent, or Firm*—Bever, Hoffman & Harms, LLP; Jeanette S. Harms

(57) ABSTRACT

An amplifier can advantageously use a power supply voltage source that provides a voltage greater than all breakdown voltages of the process associated with transistors of the amplifier. Specifically, cascoded configurations can be used to reduce the gate-drain and source-drain voltages of "at-risk" transistors in the amplifier. During a power down mode, a bias shunt of the amplifier can isolate certain nodes from the voltage sources. At the same time, a charge circuit of the amplifier can charge those nodes to a predetermined voltage, thereby minimizing stress to the at-risk transistors during the power down mode. A multi-flavor power down signal generator circuit can advantageously generate the appropriate power down signals for driving various transistors of the amplifier during the power down mode.

10 Claims, 2 Drawing Sheets

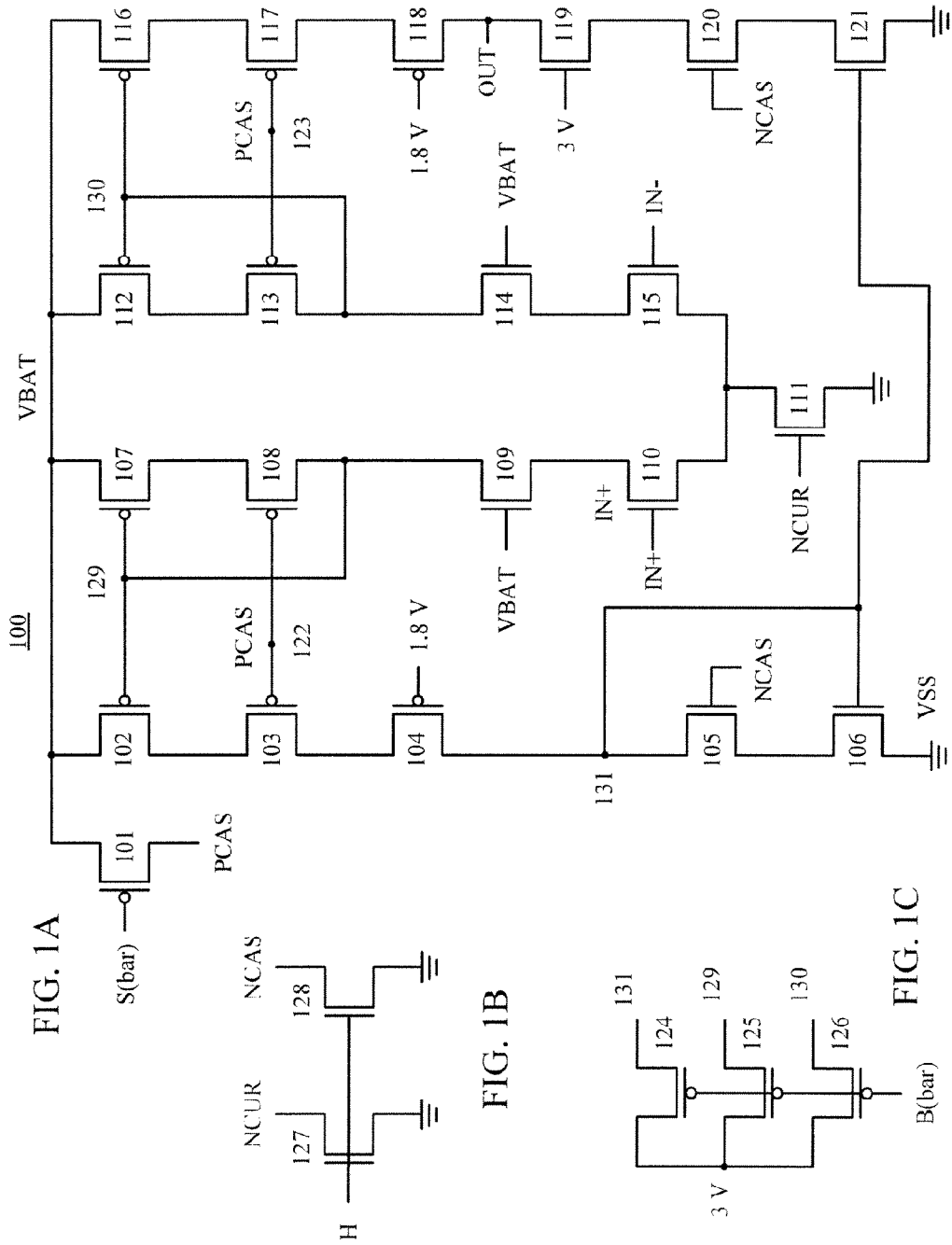

U.S. 7,642,856 B1

AMPLIFIER CAPABLE OF USING A POWER SUPPLY VOLTAGE HIGHER THAN ITS PROCESS VOLTAGES

BACKGROUND OF THE INVENTION

1. Field of the Invention

The present invention relates to an amplifier capable of using a power supply voltage higher than all of its process voltages.

2. Related Art

Modern CMOS processes are designed to operate with a certain supply voltage. If a voltage difference greater than this voltage is applied across the terminals of a transistor during operation, serious reliability problems may arise. Specifically, after repeated instances of exposure that exceeds the maximum breakdown voltage, the gate oxide of the transistor may be significantly weakened and eventually be punctured, thereby resulting in device failure.

Usually processes provide multiple "flavors" of devices, i.e. transistors that have different characteristics and therefore can sustain different voltages. For example, in an exemplary 0.18μ CMOS process, core devices are formed with a thin oxide and operate with a supply voltage of 1.8 V, whereas input/output (I/O) devices are formed with thick oxide and therefore may operate with a supply voltage of 3.3 V.

Unfortunately, integrated circuits designed for portable applications (e.g. laptops, PDAs, etc.) often operate with a battery whose power supply voltage is typically higher than 3.3 V. For example, a typical power supply voltage for a fully charged cell phone battery may be 4.2 V. In some systems, external regulators may be used to convert the battery voltage to lower voltages that may be safely used by I/O and core devices (e.g. 3.3 V and 1.8V, respectively). However, it is often desirable to interface on chip with the battery voltage, either to take advantage of the available higher power supply voltage, or to implement the supply regulators internally to the chip.

SUMMARY OF THE INVENTION

An amplifier can advantageously use a power supply voltage source that provides a voltage greater than all breakdown voltages of the process associated with transistors of the amplifier (referred to herein as the process voltages). Specifically, cascoded configurations may be used to reduce the gate-drain and source-drain voltages of "at-risk" transistors in the amplifier. During a power down mode, a bias shunt of the amplifier can isolate certain nodes from the voltage sources. At the same time, a charge circuit of the amplifier can charge those nodes to a predetermined voltage, thereby minimizing stress to the at-risk transistors during the power down mode. A multi-flavor power down signal generator circuit can advantageously generate the appropriate bias flavor power down signals for driving various transistors of the amplifier during the power down mode.

BRIEF DESCRIPTION OF THE DRAWINGS

FIG. 1A illustrates an exemplary amplifier that can advantageously operate with a battery voltage higher than the operating voltages of the process used to make transistors of the amplifier.

FIG. 1B illustrates an exemplary bias shunt of the amplifier shown in FIG. 1A.

FIG. 1C illustrates an exemplary charge circuit of the amplifier shown in FIG. 1A.

DETAILED DESCRIPTION OF THE DRAWINGS

Figure 1D:
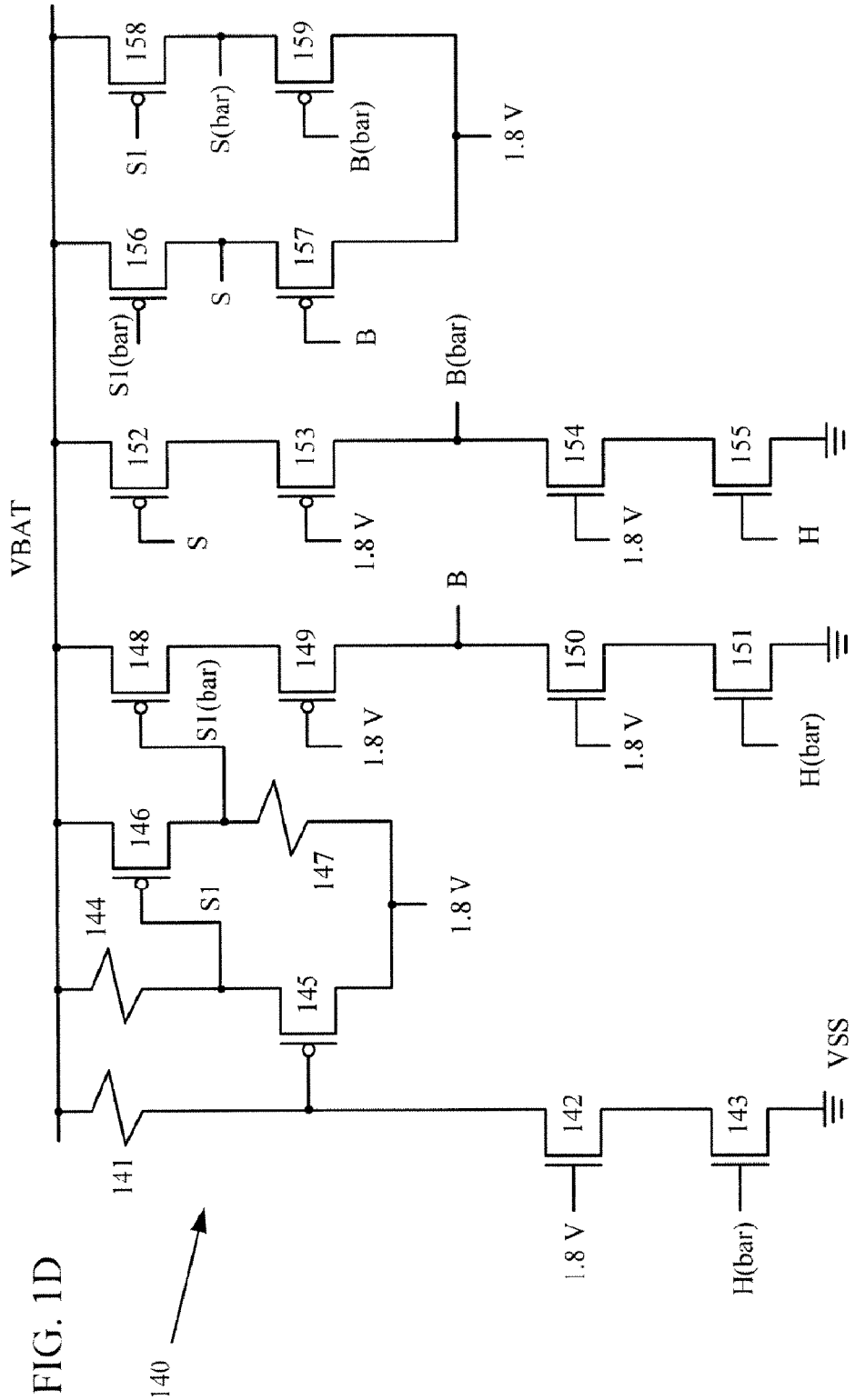
FIG. 1D illustrates an exemplary multi-flavor power down signal generator circuit of the amplifier shown in FIG. 1.

In accordance with one aspect of the invention, an amplifier can advantageously use a power supply voltage source that provides a voltage greater than all breakdown voltages of the process associated with transistors of the amplifier (referred to herein as the process voltages). This amplifier can include transistor pairs in a cascoded configuration, wherein each transistor pair has an "at-risk" transistor and a "compensation" transistor. The at-risk transistor would, without the assistance of its corresponding compensation transistor, be adversely affected by voltages provided to and/or signals received by the amplifier. In other words, the compensation transistors ensure that under various voltage conditions the at-risk transistors do not experience undue stress from voltage differentials.

The amplifier can advantageously use a plurality of flavors of a power down signal, wherein the different flavors of power down signals can provide isolation and charging functions during the power down mode. In one embodiment, a master flavor power down signal can be used to generate bias flavor power down signals. As described herein, the master flavor power down signal flavor is labeled "H" whereas the bias flavor power down signals are labeled "S" and "B". Note that each power down signal has its complementary power down signal, i.e. H and H(bar), S and S(bar), and B and B(bar).

FIG. 1A illustrates an amplifier 100 that can advantageously operate with a battery voltage (or any power supply voltage) higher than the process voltages. In one embodiment, amplifier 100 can operate with a battery power supply VBAT of 4.2 V. As described in further detail below, amplifier 100 includes transistors 101-128 in operative relation to each other.

Specifically, transistor 101 is connected between a battery voltage VBAT and a bias node PCAS. Transistor 101 receives the power down signal S(bar) on its gate. Transistors 102-106 (transistors 102-104 being PMOS transistors and transistors 105-106 being NMOS transistors) are connected in series between battery voltage VBAT and a low voltage source VSS (e.g. ground). Similarly, transistors 107-111 (transistors 107-108 being PMOS transistors and transistors 109-111 being NMOS transistors) are connected in series between battery voltage VBAT and the low voltage source VSS.

Transistors 116-121 (transistors 116-118 being PMOS transistors and transistors 119-121 being NMOS transistors) are connected in series between battery voltage VBAT and the low voltage source VSS. Transistors 112-115 (transistors 112-113 being PMOS transistors and transistors 114-115 being NMOS transistors) are connected in series between battery voltage VBAT and the drain of transistor 111.

Serving as the input terminals to amplifier 100, transistors 110 and 115 receive a differential signal (i.e. IN+ and IN−) on their gates. The drain of transistor 108 and the gates of transistors 102 and 107 are connected to a charge node 129. Similarly, the drain of transistor 113 and the gates of transistors 112 and 116 are connected to a charge node 130. The gates of transistors 103, 108, 113, and 117 are connected to the bias node PCAS. The gates of transistors 104 and 118 are connected to a first process voltage source, e.g. 1.8 V, whereas the gate of transistor 119 is connected to a second process voltage source, e.g. 3 V. The gates of transistors 109 and 114 are connected to battery voltage VBAT. The gates of transistors 105 and 120 are connected to a bias node NCAS. The drain of transistor 105 and the gates of transistors 106 and 121 are connected to a charge node 131. The gate of transistor 111 is connected to a bias node NCUR.

FIG. 1B illustrates an exemplary bias shunt that can form part of amplifier 100. In this bias shunt, transistors 127 and 128 have their sources connected to the low voltage source VSS, their gates connected power down signal H, and their drains connected to bias nodes NCUR and NCAS, respectively.

FIG. 1C illustrates an exemplary charge circuit that can form part of amplifier 100. In this charge circuit, transistors 124, 125, and 126 have their sources connected to the second process voltage source (e.g. 3 V), their gates connected to power down signal B(bar), and their drains connected to charge nodes 131, 129, and 130, respectively.

Amplifier 100 includes a plurality of transistor pairs, wherein each transistor pair has an "at-risk" transistor and its "compensation" transistor. Specifically, in amplifier 100, transistors 103 and 104 form a first transistor pair, wherein transistor 103 is the at-risk transistor and transistor 104 is its compensation transistor. In this transistor pair, transistor 103 would be significantly stressed during a power up condition without the presence of transistor 104. Transistors 109 and 110 form a second transistor pair and transistors 114 and 115 form a third transistor pair, wherein transistors 110 and 115 are the at-risk transistors and transistors 109 and 114 are their compensation transistors. With respect to these transistor pairs, either of transistors 110 and 115 would be significantly stressed during a low common mode voltage condition without the presence of transistors 109 and 114, respectively. Transistors 117 and 118 form a fourth transistor pair, wherein transistor 117 is the at-risk transistor and transistor 118 is its compensation transistor. Transistor 117 would be stressed during a low OUT signal without the presence of transistor 118. In contrast, transistors 119 and 120 form a fifth transistor pair, wherein transistor 120 is the at-risk transistor and transistor 119 is its compensation transistor. Transistor 119 would be stressed during a high OUT signal without the presence of transistor 120.

During a power down mode, the bias shunt of amplifier 100 (FIG. 1B) can advantageously isolate certain nodes from their voltage sources to minimize power. In this bias shunt embodiment, transistors 127 and 128 are turned on by a logic high power down signal H in the power down mode, thereby pulling bias nodes NCUR and NCAS to VSS and turning off transistors 105, 111, and 120 of amplifier 100. In this manner, certain nodes of amplifier 100 are isolated from the low voltage source VSS.

Similarly, also during the power down mode, transistor 101 is turned on by a logic low power down signal S(bar), thereby providing the battery voltage VBAT on the bias nodes PCAS. This voltage turns off transistors 103, 108, 113, and 117, thereby also isolating various nodes of amplifier 100 from the battery voltage VBAT. Notably, without assistance, nodes 129, 130, and 131 would float during the above-described power down mode and could drift close to VBAT or VSS in a way that stresses some transistors.

FIG. 1C illustrates an exemplary charging circuit that can advantageously minimize this stress. Specifically, this charge circuit can charge those nodes to a predetermined voltage, e.g. to approximately the second process voltage, thereby minimizing stress to the at-risk transistors during the power down mode. Specifically, during the power down mode, transistors 124, 125, and 126 of the charge circuit are turned on by a logic low power down signal B(bar), thereby respectively charging nodes 131, 129, and 130 to approximately the second process voltage, e.g. 3.3 V. This charging of nodes 129, 130, and 131 advantageously minimizes the stress experienced by the at-risk transistors of amplifier 100 during the power down mode.

As shown above, the different flavors of power down signals H, B, and S can advantageously perform both isolation and charging functions during a power down mode. The power down signal H and its corresponding power down signal H(bar), which can be generated by user or system command, are associated with the second process voltage source and therefore, in this embodiment, vary from 0 V to 3 V. As discussed above, the power down signal H in the power down mode is 3 V (and thus, logically, the power down signal H(bar) is 0 V).

FIG. 1D illustrates a multi-flavor power down signal generator circuit 140 that can advantageously generate the bias flavor power down signals (i.e. B and S) described above in reference to amplifier 100. The power down signal S and its corresponding power down signal S(bar) are referenced herein as the first bias flavor power down signals, whereas the power down signal B and its corresponding power down signal B(bar) are referenced herein as the second bias flavor power down signals. The power down signals B and B(bar) are associated with the battery supply voltage and therefore, in this embodiment, vary from 0 V to 4.2 V. The power down signal B(bar) in the power down mode is 0 V (and thus, logically, the power down signal B is 4.2 V). The power down signals S and S(bar) are associated with the first process voltage source and vary from 1.8 V to 4.2 V in this embodiment. The power down signal S(bar) in the power down mode is 1.8 V (and thus, logically, the power down signal S is 4.2 V). Note that multi-flavor power down signal generator circuit 140 also generates power down signals S1 and its corresponding power down signal S1(bar), which in turn generate power down signals S and S(bar)(described below). Power down signals S1 and S1(bar) are called bias slave power down signals herein.

Circuit 140 uses the master flavor power down signals H and H(bar) to generate the bias slave power down signals S1 and S1(bar) and the bias flavor power down signals B, B(bar), S, and S(bar). In this embodiment, circuit 140 includes a plurality of resistors 141, 144, and 147 as well as a plurality of transistors 142, 143, 145, 146, and 148-159. Resistor 141 and transistors 142 and 143 are connected in series between battery voltage VBAT and the low voltage source VSS. Resistor 144 and transistor 145 are connected in series between battery voltage VBAT and the first process voltage source (e.g. 1.8 V). Transistor 146 and resistor 147 are connected in series between battery voltage VBAT and the first process voltage source (e.g. 1.8 V). Transistors 148-151 are connected in series between battery voltage VBAT and the low voltage source VSS. Similarly, transistors 152-155 are connected in series between battery voltage VBAT and the low voltage source VSS. Transistors 156 and 157 are connected in series between battery voltage VBAT and the first process voltage source (e.g. 1.8 V). Similarly, transistors 158 and 159 are connected in series between battery voltage VBAT and the first process voltage source (e.g. 1.8 V). Transistors 142, 149, 150, 153, 154 have gates connected to the first process voltage source (e.g. 1.8 V).

As noted above, during a power down mode, the master flavor power down signal H is a logic high signal. Therefore, the corresponding master flavor power down signal H(bar) is a logic low signal that turns on transistors 143 and 151 and turns off transistor 155. As a result, a logic high signal (from VBATT via resistor 141) is provided to the gate of transistor 145, thereby turning off transistor 145. Similarly, with transistor 145 not on, the gate of transistor 146 also receives a logic high voltage (from VBATT via resistor 144), thereby turning off transistor 146. Thus, the bias slave flavor power down signal (i.e. the signal provided to the gate of transistor 146) S1 is a logic high signal. With transistor 146 off, the gate of transistor 148 receives a logic low signal (from intermediate voltage 1.8 V via resistor 147), thereby turning on transistor 148. Thus, the bias slave flavor power down signal S1(bar) (i.e. the signal provided to the gate of transistor 148) is a logic low signal during the power down mode.

With transistor 151 off, transistor 150 is also turned off, thereby allowing the bias flavor power down signal B to be driven by transistors 148 and 149, which are both conducting. Thus, the bias flavor power down signal B is a logic high signal during the power down mode. In contrast, with transistor 152 off, transistor 153 is also turned off, thereby allowing the bias flavor power down signal B(bar) to be driven by transistors 155 and 154, which are both conducting. Thus, the bias flavor down signal B(bar) is a logic low signal during the power down mode.

Notably, the bias slave flavor power down signals S1 and S1(bar) and the bias flavor power down signals B and B(bar) are provided to drive the gates of transistors 158, 156, 157, and 159, respectively. As a result, transistors 156 and 159 are turned on and transistors 157 and 158 are turned off, thereby generating the bias flavor power down signals S and S(bar), respectively. Because each flavor of power down signals drives one or more gates, multi-flavor power down signal generator circuit 140 dissipates insignificant power in the power down mode. Moreover, in this configuration, multi-flavor power down signal generator circuit 140 minimizes stress on its transistors, even with its direct connection to the battery voltage VBAT.

Note that in a normal operating mode, the power down signals would have opposite logic signals than those in the power down mode, thereby effectively deactivating multi-flavor power down signal generator circuit 140. Moreover, referring to FIG. 1B, nodes NCUR and NCAS are actually connected to a reference voltage circuit (not shown, but well known to those skilled in the art of amplifiers) that can be deactivated during the above-described power down mode and activated during the normal operating mode.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

Accordingly, it is intended that the scope of the invention be defined by the following Claims and their equivalents.

The invention claimed is:

1. An amplifier receiving a power supply voltage that is greater than all breakdown voltages of a process associated with transistors of the amplifier, the amplifier comprising:
   a plurality of transistor pairs, each transistor pair having an at-risk transistor and a corresponding compensation transistor, the plurality of transistor pairs having a cascoded configuration;
   a bias shunt for isolating a plurality of nodes of the amplifier from a low voltage source and a power supply voltage source during a power down mode;
   a charge circuit for charging the plurality of nodes to a predetermined voltage during the power down mode, thereby minimizing stress to the at-risk transistors during the power down mode; and
   a multi-flavor power down signal generator circuit for generating bias flavor power down signals, the bias flavor power down signals for driving various transistors of the amplifier during the power down mode.

2. An amplifier connected to a low voltage source, a first process voltage source, a second process voltage source, and a power supply voltage source that provides a voltage higher than voltages provided by the first and second process voltage sources, the amplifier comprising:
   a first transistor connected between the power supply voltage source and a bias node PCAS, respectively;
   a second transistor, a third transistor, a fourth transistor, a fifth transistor, and a sixth transistor connected in series between the power supply voltage source and the low voltage source;
   a seventh transistor, an eighth transistor, a ninth transistor, a tenth transistor, and an eleventh transistor connected in series between the power supply voltage source and the low voltage source;
   a twelfth transistor, a thirteenth transistor, a fourteenth transistor, a fifteenth transistor, and the eleventh transistor connected in series between the power supply voltage source and the low voltage source; and
   a sixteenth transistor, a seventeenth transistor, an eighteenth transistor, a nineteenth transistor, a twentieth transistor, and a twenty-first transistor connected between the power supply voltage source and the low voltage source,
   wherein each transistor of the amplifier has a gate, a source, and a drain,
   wherein the gate of the first transistor receives a complement of a first bias flavor power down signal,
   wherein the drain of the eighth transistor and the gates of the second and seventh transistors are connected to a first charge node,
   wherein the drain of the thirteenth transistor and the gates of the twelfth and sixteenth transistors are connected to a second charge node,
   wherein the gates of third, eighth, thirteenth, and seventeenth transistors are connected to the first bias node,
   wherein the gates of the fourth and eighteenth transistors are connected to the first process voltage source,
   wherein the gate of the nineteenth transistor is connected to the second process voltage source,
   wherein the gates of the ninth and fourteenth transistors are connected to the power supply voltage source,
   wherein the gates of the fifth and twentieth transistors are connected to a second bias node,
   wherein the drain of the fifth transistor and the gates of the sixth and twenty-first transistors are connected to a third charge node,
   wherein the gate of the eleventh transistor is connected to a third bias node,
   wherein the tenth and fifteenth transistors receive a differential input signal to the amplifier, and
   wherein the drains of the eighteenth and nineteenth transistors provide an output signal of the amplifier.

3. The amplifier of claim 2, further including a charge circuit the charge circuit comprising:
   a twenty-second transistor, a twenty-third transistor, and a twenty-fourth transistor,
   each transistor of the charge circuit including a source, a drain, and a gate,
   wherein the sources of the twenty-second, twenty-third, and twenty-fourth transistors are connected to the first process voltage source,
   wherein the gates of the twenty-second, twenty-third, and twenty-fourth transistors are connected to a complement of a second bias flavor power down signal, and wherein the drains of the twenty-second, twenty-third, and twenty-fourth transistors are connected to third, first, and second charge nodes, respectively.

4. The amplifier of claim 3, further including a bias shunt, the bias shunt comprising:
a twenty-fifth transistor and a twenty-sixth transistor, each transistor of the bias shunt including a source, a drain, and a gate,
wherein the sources of the twenty-fifth and twenty-sixth transistors are connected to the low voltage source,
wherein the gates of the twenty-fifth and twenty-sixth transistors are connected to a master flavor power down signal, and
wherein the drains of the twenty-fifth and twenty-sixth transistors are connected to the third and second bias nodes, respectively.

5. The amplifier of claim 4, further including a multi-flavor power down signal generator circuit, the multi-flavor power down signal generator circuit comprising:
a first resistor, a twenty-seventh transistor, and a twenty-eighth transistor connected in series between the power supply voltage source and the low voltage source;
a second resistor and a twenty-ninth transistor connected in series between the power supply voltage source and the first process voltage source;
a thirtieth transistor and a third resistor connected in series between the power supply voltage source and the first process voltage source;
a thirty-first transistor, a thirty-second transistor, a thirty-third transistor, and a thirty-fourth transistor connected in series between the power supply voltage source and the low voltage source,
a thirty-fifth transistor, a thirty-sixth transistor, a thirty-seventh transistor, and a thirty-eighth transistor connected in series between the power supply voltage source and the low voltage source,
a thirty-ninth transistor and a fortieth transistor connected in series between the power supply voltage source and the first process voltage source,
a forty-first transistor and a forty-second transistor connected in series between the power supply voltage source and the first process voltage source,
each transistor of the multi-flavor power down signal generator circuit having a source, a drain, and a gate,
wherein the gates of the twenty-seventh, thirty-second, thirty-third, thirty-sixth, thirty-seventh transistors are connected to the first process voltage source,
wherein the gates of the twenty-eighth and thirty-fourth transistors receive a complement of the master flavor power down signal and the gate of the thirty-eighth transistor receives the master flavor power down signal,
wherein the source of the twenty-ninth transistor generates a bias slave flavor power down signal, which drives the gates of the thirtieth and forty-first transistors,
wherein the drain of the thirtieth transistor generates a complement of the bias slave flavor power down signal, which drives the gates of the thirty-first and thirty-ninth transistors,
wherein the drains of the thirty-ninth and forty-first transistors generate the first bias flavor power down signal and a complement of the first bias flavor power down signal, respectively, the first bias flavor power down signal driving the gate of the thirty-fifth transistor,
wherein the drain of the thirty-second transistor generates the second bias flavor power down signal, which drives the gate of the fortieth transistor, and wherein the drain of the thirty-sixth transistor generates a complement of the second bias flavor power down signal, which drives the gate of the forty-second transistor.

6. The amplifier of claim 5, wherein the first, second, third, fourth, seventh, eighth, twelfth, thirteenth, sixteenth, seventeenth, and eighteenth, twenty-second, twenty-third, twenty-fourth, twenty-ninth, thirtieth, thirty-first, thirty-second, thirty-fifth, thirty-sixth, thirty-ninth, fortieth, forty-first, and forty-second transistors are PMOS transistors, and wherein the fifth, sixth, ninth, tenth, eleventh, fourteenth, fifteenth, nineteenth, twentieth, twenty-first, twenty-fifth, twenty-sixth, twenty-seventh, twenty-eighth, thirty-third, thirty-fourth, thirty-seventh, thirty-eighth transistors are NMOS transistors.

7. A method of operating an amplifier during a power down mode, the amplifier connected to a power supply voltage source that provides a higher voltage than voltages provided by any process voltage source of the amplifier, the method comprising:
isolating predetermined nodes from a low voltage source and the power supply voltage source to minimize power consumption;
charging the predetermined nodes to a predetermined voltage during the power down mode, the predetermined voltage being a process voltage; and
generating a plurality of bias flavor power down signals for driving various transistors of the amplifier during the power down mode,
wherein charging the predetermined nodes and generating the plurality of bias flavor power down signals minimizes stress to at-risk transistors in the amplifier.

8. An amplifier comprising:
a plurality of transistor pairs having cascoded configurations, each transistor pair having an at-risk transistor and a corresponding compensation transistor;
a bias shunt for isolating a plurality of nodes of the amplifier from a low voltage source and a power supply voltage source during a power down mode;
a charge circuit for charging the plurality of nodes to a predetermined voltage during the power down mode; and
a power down signal generator circuit for generating multiple power down signals for the amplifier, thereby allowing the amplifier to safely receive a power supply voltage that is greater than all breakdown voltages of a process associated with any of the plurality of transistor pairs.

9. An amplifier comprising:
a circuit responsive to a plurality of power down signals during a power down mode, the circuit including a plurality of transistor pairs, each transistor pair having an at-risk transistor and a corresponding compensation transistor, wherein the circuit is configured to safely receive a power supply voltage that is greater than all breakdown voltages of a process associated with any transistors of the amplifier.

10. A power down signal generator comprising:
a circuit responsive to a master flavor power down signal that generates multiple flavor power down signals for an amplifier during a power down mode, the circuit including a plurality of transistor pairs, each transistor pair having an at-risk transistor and a corresponding compensation transistor, wherein the circuit is configured to safely receive a power supply voltage that is greater than all breakdown voltages of a process associated with any transistors of the power down signal generator.

* * * * *

UNITED STATES PATENT AND TRADEMARK OFFICE
CERTIFICATE OF CORRECTION

PATENT NO.         : 7,642,856 B1                                               Page 1 of 1
APPLICATION NO.    : 11/421053
DATED              : January 5, 2010
INVENTOR(S)        : Terrovitis It is certified that error appears in the above-identified patent and that said Letters Patent is hereby corrected as shown below:

In the Claims

Column 6
Claim 2, Line 9, insert --first-- before "bias node".
Claim 2, Line 9, delete "PCAS, respectively".
Claim 3, Line 63, amend "first" to --second--.

Signed and Sealed this
Eighteenth Day of March, 2014

Michelle K. Lee
*Deputy Director of the United States Patent and Trademark Office*